United States Patent
O'Donnell et al.

(10) Patent No.: US 7,503,977 B1
(45) Date of Patent: Mar. 17, 2009

(54) SOLIDIFYING LAYER FOR WAFER CLEANING

(75) Inventors: Robert J. O'Donnell, Fremont, CA (US); Thomas W. Anderson, Hayward, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/237,190

(22) Filed: Sep. 27, 2005

(51) Int. Cl.
*B05B 7/06* (2006.01)
*B05B 5/00* (2006.01)
*B05C 11/10* (2006.01)

(52) U.S. Cl. .................... 118/313; 118/63; 118/642

(58) Field of Classification Search ........... 118/52, 118/612, 319, 320, 300, 313, 58, 62, 63, 118/641–643; 396/604, 611, 627; 427/240; 134/153, 902, 198; 219/411, 405; 430/397, 430/396, 5, 935
See application file for complete search history.

(56) References Cited

U.S. PATENT DOCUMENTS

| | | | |
|---|---|---|---|
| 5,976,256 A * | 11/1999 | Kawano | ........... 118/684 |
| 6,463,674 B1 * | 10/2002 | Meyers et al. | ........... 34/304 |
| 6,550,990 B2 * | 4/2003 | Sakurai et al. | ........... 396/604 |
| 6,954,993 B1 * | 10/2005 | Smith et al. | ........... 34/407 |
| 6,988,326 B2 * | 1/2006 | O'Donnell et al. | ........... 34/381 |
| 7,009,148 B2 * | 3/2006 | Kawano et al. | ........... 219/411 |
| 2004/0165883 A1 * | 8/2004 | Nakamura et al. | ........... 396/611 |

* cited by examiner

*Primary Examiner*—Yewebdar T Tadesse
(74) *Attorney, Agent, or Firm*—Martine Penilla & Gencarella, LLP

(57) ABSTRACT

A substrate preparation system includes a proximity head configured to be positioned near a surface of the substrate to deliver a solution to the surface of the substrate. The proximity head includes a plurality of inlets for delivering the solution and a plurality of outlets for removing a portion of the solution from the surface of the substrate. The surface of the substrate maintains a remaining portion of the solution as a coherent film after the proximity head is scanned over the surface of the substrate. The coherent film is configured to be cured. The remaining portion of the solution acts on the surface of the substrate and binds particulates present on the surface of the substrate as the coherent film cures.

6 Claims, 14 Drawing Sheets

SOLIDIFYING LAYER FOR WAFER CLEANING

CROSS REFERENCE TO RELATED APPLICATION

This is application is related to co-pending U.S. patent application Ser. No. 10/261,839, entitled "Method and Apparatus for Drying Semiconductor Wafer Surfaces Using a Plurality of Inlets and Outlets Held in Close Proximity to the Wafer Surfaces" filed on Sep. 30, 2002. This patent application is hereby incorporated by reference.

BACKGROUND

The present invention pertains to preparation of substrates, and more particularly, to apparatus and methods for preparing a surface of a substrate.

In the fabrication of semiconductors, it is well known that there is a need to prepare the surface of a substrate during the fabrication process. For example, surface preparation of a substrate may include removing any unwanted material from the surface of the substrate. Unwanted material on the surface of a substrate can cause undesirable effects to the fabricated semiconductor, which can result in a defective integrated circuit (IC). Accordingly, it is desirable to prepare the surface of a substrate to remove any unwanted material from the surface at different stages of the fabrication process.

SUMMARY

Broadly speaking, the present invention provides systems and methods for preparing surfaces of substrates, e.g., semiconductor wafers. Of course, other substrates, such as those used in the hard drive industry may also make use to the teachings described herein. More particularly, embodiments of the present invention provide apparatus and methods to prepare the processing surface of substrates.

In one embodiment, a substrate preparation system includes a proximity head configured to be positioned near a surface of the substrate to deliver a solution to the surface of the substrate. The proximity head includes a plurality of inlets for delivering the solution and a plurality of outlets for removing a portion of the solution from the surface of the substrate. The surface of the substrate maintains a remaining portion of the solution as a coherent film after the proximity head is scanned over the surface of the substrate. The coherent film is configured to be cured. The remaining portion of the solution acts on the surface of the substrate and binds particulates that are present on the surface of the substrate as the coherent film cures.

In another embodiment, a method for preparing a surface of a substrate is provided. The method includes generating a meniscus for applying a solution to the surface of the substrate. The meniscus is traversed over the surface of the substrate to define a coherent film. The coherent film is defined by the solution and the coherent film is configured to act on the surface of the substrate and bind particulates that are present on the surface of the substrate.

Other aspects and advantages of the present invention will become apparent from the following description, taken in conjunction with the accompanying drawings, illustrating by way of examples the principles of the invention.

BRIEF DESCRIPTION OF THE DRAWINGS

The present invention will be readily understood by the following detail description in conjunction with the accompanying drawings, and like reference numerals designating like structural elements.

DETAILED DESCRIPTION

The present invention, as illustrated by the following embodiments, provides systems and methods for preparing surfaces of substrates, and in particular semiconductor wafers. More specifically, embodiments of the present invention provide apparatus and methods to treat surfaces of substrates and remove particulates that are present on the surfaces of substrates. As should be appreciated, the present invention can be implemented in numerous ways, including systems or methods. In some instances, well known process operations and components have not been described in detail in order to avoid obscuring the embodiments of the present invention.

Figure 1:
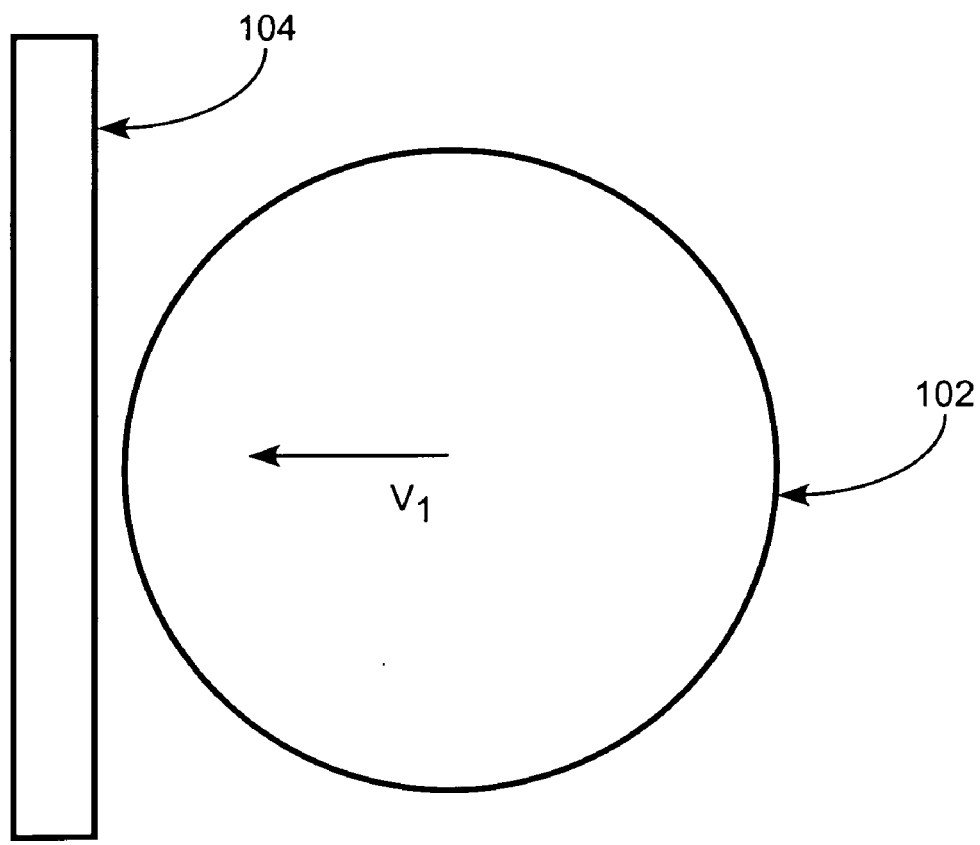
FIG. 1 is a diagram of a top view of a substrate and a proximity head, in accordance with one embodiment of the present invention.

FIG. 1 is a diagram of a top view of a substrate and a proximity head in accordance with one embodiment of the present invention. As illustrated in FIG. 1, substrate 102 is scanned beneath the proximity head 104 at a velocity $V_1$. Although in FIG. 1 the proximity head 104 is illustrated as being stationary, in other embodiments of the present invention, the proximity head 104 may not be stationary. For example, the proximity head 104 may be scanned over the substrate 102 at a velocity $V_2$, while the substrate 102 is stationary. In a further embodiment of the present invention, both the substrate 102 and the proximity head 104 may be in motion (e.g., the substrate 102 is scanned in one direction at a velocity $V_1$, while the proximity head may be scanned in another direction at a velocity $V_2$).

The examples provided herein define a proximity head 104 which is placed over a single side of the substrate 102. However, the embodiments can be modified so that both sides of the substrate 102 are prepared at the same time, where one proximity head prepares a first side of the substrate 102 and another proximity head prepares a second side of the substrate 102. The preparation of the first and second sides can be completed at the same time or at different times. For simplicity, however, the teachings of the invention will concentrate on the treatment of one side of the substrate 102.

Figure 2:
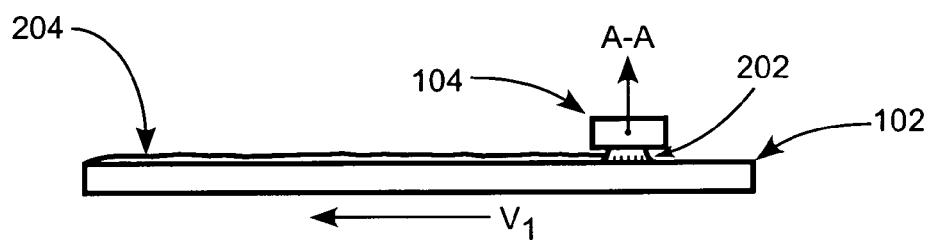
FIG. 2 is a diagram of a side view of a substrate and a proximity head, in accordance with one embodiment of the present invention.

FIG. 2 is a diagram of a side view of the substrate 102 and proximity head 104 in accordance with one embodiment of the present invention. As shown in FIG. 2, substrate 102 is scanned under the proximity head 104 at a velocity $V_1$. The proximity head 104 delivers a solution to the surface of the substrate 102 as the substrate 102 is scanned underneath the proximity head 104. As will be discussed in detail, the solution is delivered from the proximity head 104 to the surface of the substrate 102 by way of a meniscus 202. The meniscus 202 is maintained between the proximity head 104 and the surface of the substrate 102. A remaining portion of the solution is maintained on the surface of the substrate 102 as a coherent film 204 after the substrate 102 is scanned underneath the proximity head 104. In another embodiment of the present invention, the proximity head 104 is scanned over the substrate 102 as the coherent film 204 is maintained on the surface of the substrate 102. The coherent film 204 is configured to be cured on the surface of the substrate 102. The cured coherent film 204, can be said to have at least partially solidify (e.g., coagulate/cross link/gel) into the coherent film.

Figure 3:
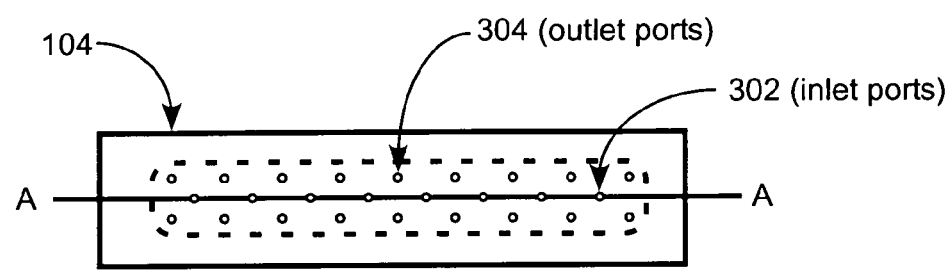
FIG. 3 is a diagram of a bottom view of a proximity head, in accordance with one embodiment of the present invention.

FIG. 3 shows section A-A of FIG. 2, which is a diagram of a bottom view of the proximity head 104 in accordance with one embodiment of the present invention. The bottom view of proximity head 104 shows a plurality of inlet ports 302 and a plurality of outlet ports 304. As will be discussed in more detail, the plurality of inlet ports 302 deliver a solution to the surface of substrate 102, and the plurality of outlet ports 304 remove a portion of the solution from the surface of the substrate 102. The combination of having the solution being delivered from the plurality of inlet ports 302 and a portion of the solution being removed by the plurality of outlet ports 304 maintains a meniscus between the proximity head 104 and the substrate 102. A remaining portion of the solution is maintained on the surface of the substrate 102 as a coherent film 204 (i.e., the portion of the solution remains on the surface after the proximity head 104 passes by). The coherent film 204 is configured to be cured on the surface of the substrate 102.

Figure 4:
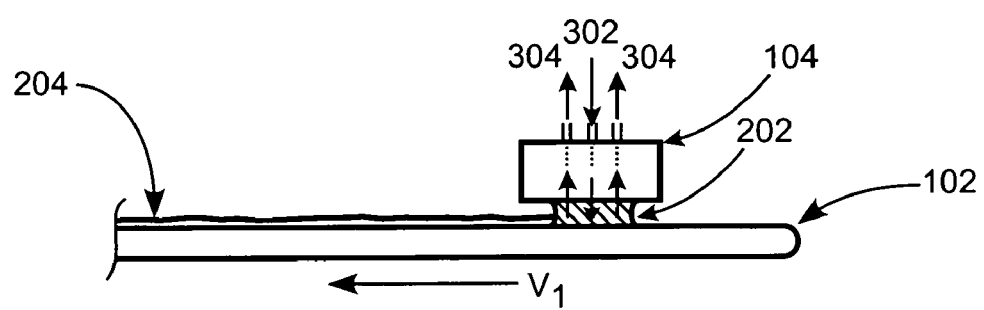
FIG. 4 is a diagram of another side view of a substrate and a proximity head, in accordance with one embodiment of the present invention.

FIG. 4 is a diagram of another side view of the substrate 102 and proximity head 104 in accordance with one embodiment of the present invention. As shown in FIG. 4, substrate 102 is scanned beneath proximity head 104 at a velocity $V_1$, while proximity head 104 may be stationary or in motion. For example, the proximity head 104 may be scanned over the substrate 102 at a velocity $V_2$, while at the same time, substrate 102 may be scanned beneath proximity bar 104 at a velocity $V_1$. The plurality of inlet ports 302 deliver a solution on to the surface of substrate 102, and a plurality of outlet ports 304 remove a portion of the solution that is being delivered to the surface of substrate 102. The combination of having the solution being delivered from the plurality of inlet ports 302 and a portion of the solution being removed by the plurality of outlet ports 304 maintains a meniscus between the proximity head 104 and the substrate 102. A remaining portion of the solution forms a coherent film 204 on the surface of the substrate 102. The coherent film 204 is configured to be cured on the surface of the substrate 102. Although not shown, the inlet ports 302 and outlet ports 304 are connected to conduits that deliver and remove the fluids. The conduits are connected to facilities of a substrate preparation building, such as a process clean room. In another embodiment, the system is not connected to building facilities, but alternative chemicals and fluids are loaded directly into the machine via a carboy or other portable apparatus.

Figure 5:
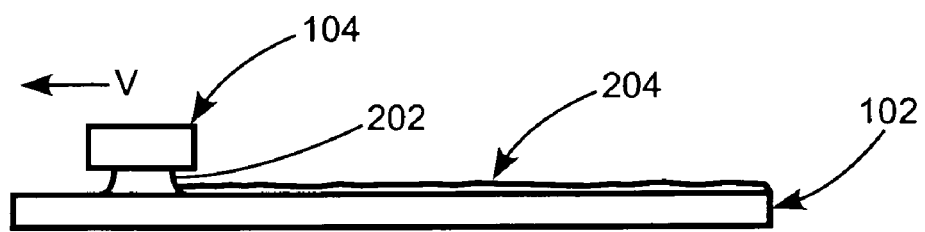
FIG. 5 is a diagram of yet another side view of a substrate and a proximity head, in accordance with one embodiment of the present invention.

FIG. 5 is a diagram of a yet another side view of substrate 102 and proximity head 104 in accordance with another embodiment of the present invention. Proximity head 104 is scanned over substrate 102 with meniscus 202 maintained between the proximity head 104 and substrate 102. The meniscus 202 delivers a solution to the surface of substrate 102. The solution may include an acid component, for example, hydrofluoric acid (HF). Alternatively, the solution may include a base. One purpose of the solution is to treat the surface of the substrate 102. For example, surface treatment of the substrate 102 includes dissolving a residue film of material on the surface of the substrate 102. The residue film of material on the surface of the substrate 102 may be an oxide film. Another purpose of the solution includes binding particles on the surface of the substrate 102 to the coherent film 204 that is maintained on the surface of the substrate 102.

In addition, the solution may include chelating agents, for example, TMAH, acetic acid, citric acid, etc. Furthermore, the solution may also include cleaning components, for example, SC1, SC2, etc. Further still, the solution may also include cleaning solvents or semi-aqueous solvents, for example, EKC265, ST22, Deer Kleen, etc. As discussed previously, the substrate 102 maintains a remaining portion of the solution on its surface to form a coherent film 204. The coherent film 204 is configured to be cured on the surface of substrate 102. As the coherent film 204 is cured on the surface of the substrate 102, any particles on the surface of the substrate 102 are securely bound to the cured coherent film 204.

Figure 6A:
FIG. 6A is a diagram of a substrate and a coherent film on a surface of the substrate, in accordance with one embodiment of the present invention.

FIG. 6A is a diagram of the substrate 102 and the coherent film 204 in accordance with one embodiment of the present invention. As shown in FIG. 6A, coherent film 204 covers the entire surface of the substrate 102. The coherent film 204 is formed by the application of a solution on the surface of substrate 102 by a proximity head 104. The proximity head 104 may have a length that is greater than the diameter of substrate 102, such that the entire surface of the substrate 104 may be covered by the coherent film 204 by one scan or pass of either the proximity head 104 over the substrate 102 or the substrate 102 beneath the proximity head 104.

Figure 6B:
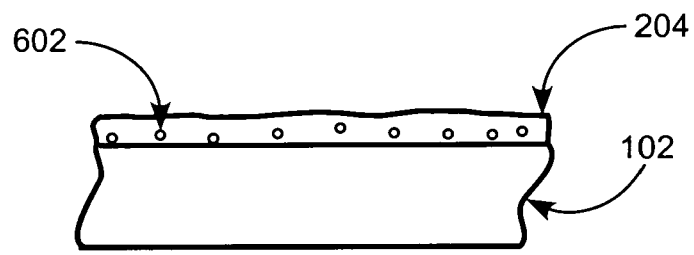
FIG. 6B is a diagram of a close-up view of a substrate and a coherent film on a surface of the substrate, in accordance with one embodiment of the present invention.

FIG. 6B is a diagram of a close-up view of the substrate 102 and coherent film 204 on a surface of the substrate 102 in accordance with one embodiment of the present invention. The coherent film 204 has incorporated particles 602 found on the surface of substrate 102. As shown in the figure, the particles 602 are incorporated into the coherent film 204.

Figure 6C:
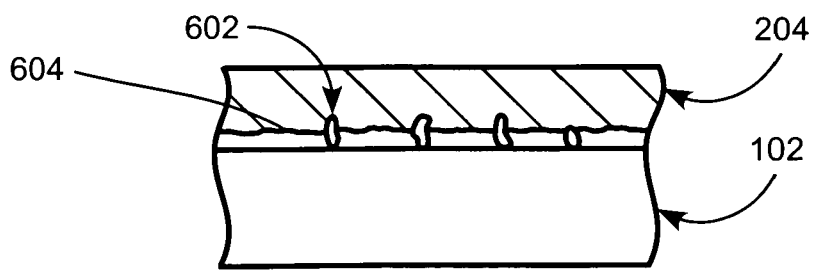
FIG. 6C is a diagram of another close-up view of a substrate and a coherent film on a surface of the substrate, in accordance with one embodiment of the present invention.

FIG. 6C is a diagram of another close-up view of the substrate 102 and coherent film 204 in accordance with one embodiment of the present invention. This close-up view shows that the coherent film 204 has incorporated particles 602 and interacted with a residue film 604 on the substrate surface 102. The interaction between the coherent film 204 and the residue film 604 may cause the residue film 604 to dissolve. In another embodiment of the present invention, the interaction between the solution defining the coherent film 204 and the residue film 604 may cause the residue film 604 to be bound to the coherent film 204. The residue film 604 may be an oxide film that has formed over the surface of substrate 102, e.g., silicon dioxide. Other residue films may include copper and copper alloys, aluminum and aluminum alloys, silicon nitride, bare silicon, silicon dioxide, low k dielectric films, high k dielectric films, organic films, inorganic films, mixtures of films (i.e. dual damascene structures of patterned SiO2 over copper), implanted films, and the like.

The coherent film 204 is configured to be cured on the surface of the substrate 102. As the coherent film 204 is cured, particles 602 on the surface of the substrate are bound in the cured coherent film 204. In addition, the undissolved residue film 604 is also bound in the cured coherent film 204. The cured coherent film 204 may be removed as a cured film of material. By removing the cured coherent film 204, the particles 602 and residue film 604 or the dissolved components of the residue film 604 are also removed from the surface of the substrate 102 as the cured coherent film 604 is removed. Thus, after the removal of the coherent film 204, the surface of the substrate is free of particles 602 and the residue film 604 or the dissolved components of the residue film 604.

Figure 7:
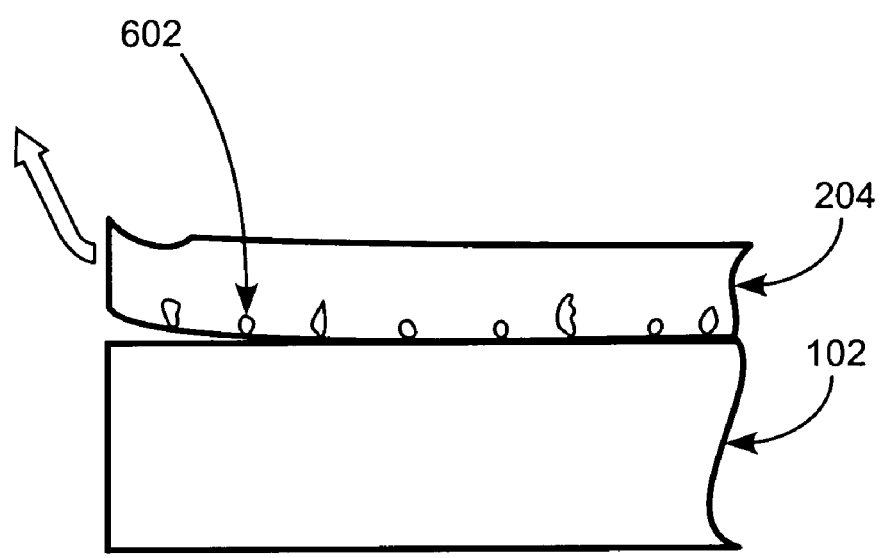
FIG. 7 is a diagram of yet another close-up view of a substrate and a coherent film on a surface of the substrate, in accordance with one embodiment of the present invention.

FIG. 7 is a diagram of another close-up view of the substrate 102 and coherent film 204 in accordance with one embodiment of the present invention. FIG. 7 shows that the solution forming the coherent film 204 has interacted with the residue film 604, and the residue film 604 was dissolved. In addition, the coherent film 204 has bound particles 602. As the coherent film is cured, particles 602 are securely bound within the coherent film 602. As shown in FIG. 7, the coherent film 204 is being removed from the surface of the substrate 102. The cured coherent film 204 may be removed from the surface of the substrate 102 by any appropriate method. The cured coherent film 204 may be removed mechanically, e.g., the cured coherent film 204 may be mechanically peeled from the surface of substrate 102.

In another embodiment of the present invention, the residue film 604 may not be dissolved by the solution forming the coherent film 204. Instead, the residue film 604 is incorporate in to the coherent film 204. After the coherent film 204 is cured, the residue film 604 is securely bound in the cured coherent film 204. The bound reside film 604 is removed from the surface of the substrate 102 as part of the cured coherent film 204 as the cured coherent film 204 is removed.

Figure 8:
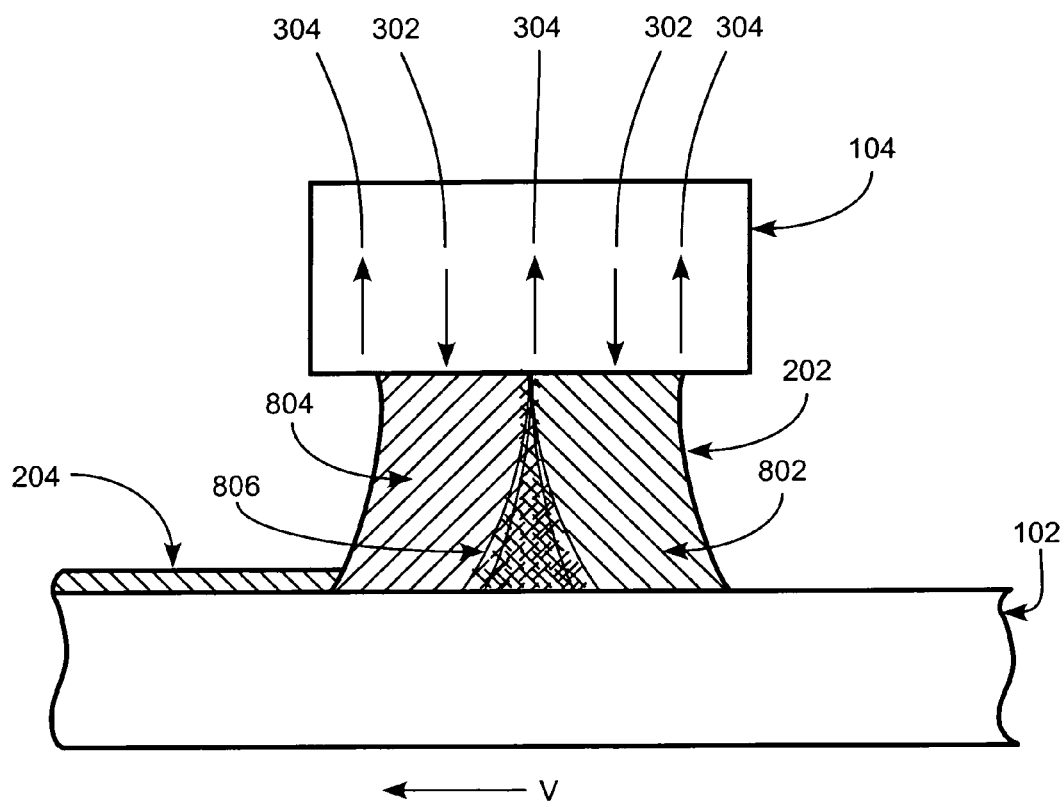
FIG. 8 is a diagram of a close-up view of a substrate and a proximity head, in accordance with one embodiment of the present invention.

FIG. 8 shows a close-up side view of substrate 102, proximity head 104, and meniscus 202 in accordance with one embodiment of the present invention. The meniscus 202 delivers a solution to a surface of the substrate 102. As shown in FIG. 8, substrate 102 is scanned beneath the proximity head 104. A plurality of inlet ports 302 deliver a solution to the surface of the substrate 102, and a plurality of outlet ports 304 remove a portion of the solution. The combination of having the solution being delivered from the plurality of inlet ports 302 and a portion of the solution being removed by the plurality of outlet ports 304 maintains a meniscus between the proximity head 104 and the substrate 102. A remaining portion of the solution forms a coherent film 204 on the surface of the substrate 102.

In one embodiment of the present invention, the plurality of inlet ports 302 deliver a pre-mixed solution on to the surface of the substrate 102. The pre-mixed solution contains all the necessary components to interact with a residue film 604 and/or bind particles 602 on the surface of the substrate 102 to the coherent film 204.

In one embodiment of the present invention, the pre-mixed solution may interact with the residue film 604 by dissolving it. In addition, the pre-mixed solution may interact with the particles 602 by binding the particles 602 within the coherent film 204. In another embodiment of the present invention, the pre-mixed solution may interact with the residue film 604 by incorporating the residue film 604 to the coherent film 204. As the coherent film 204 is cured, the residue film 604 and particles 602 are bound to the cured coherent film 204. The residue film 604 and particles 602 are removed as the cured coherent film 204 is removed from the surface of the substrate 102.

In another embodiment of the present invention, the plurality of inlet ports 302 deliver a first sub-solution and a second sub-solution to be mixed on the surface of the substrate 102 to define the solution. As illustrated in FIG. 8, inlet ports 302 deliver a first sub-solution 802 and a second sub-solution 804. The first sub-solution 802 and second sub-solution 804 are mixed on the surface of the substrate 102 to define or form the solution, which is maintained on the surface of the substrate 102 as a coherent film 204. The first sub-solution 802 may contain a cleaning solution capable of treating a residue film 604 on the surface of the substrate 102. The second sub-solution 804 may contain a chelating agent that is capable of binding particles 602 to the coherent film 204. The solution of the coherent film 204 treats the residue film 604 by either dissolving it or incorporating it to the coherent film 204. As the coherent film 204 is cured and removed, the residue film 604 or the dissolved components of the residue film 604 and particles 602 are also removed from the surface of substrate 102.

Figure 9:
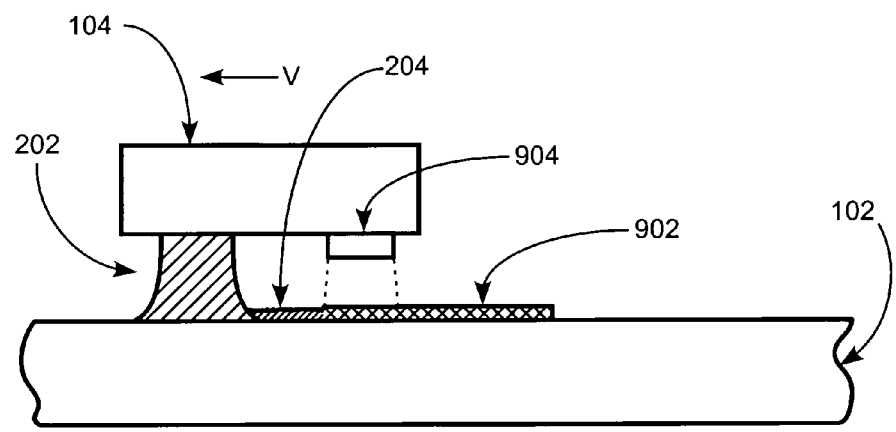
FIG. 9 is a diagram of a substrate, a proximity head, and a light source, in accordance with one embodiment of the present invention.

FIG. 9 shows a substrate 102, proximity head 104, and light source 904 in accordance with one embodiment of the present invention. The light source 904 is coupled to the proximity head 104. The light source 904 is configured to cure the coherent film 204. As shown in FIG. 9, the proximity head 104 is scanned across the surface of the substrate 102. The proximity head 104 delivers a solution to form the coherent film 204 on the surface of the substrate 102 by means of a meniscus 202. The light source 904 is capable of providing any suitable form of light in a sufficient quantity for curing the coherent film 204. The light source 904 may provide ultraviolet light, infrared light or any suitable form of light that is capable of curing the coherent film 204. The coherent film 204 is exposure to the light provided by the light source 904. The coherent film 204 is cured to form a cured coherent film 902. The cured coherent film 902 can be removed from the surface of the substrate 102 by any suitable mechanical means, e.g., the cured coherent film 902 may be mechanically peeled from the surface of the substrate 102.

In another embodiment of the present invention, the light source 904 may be coupled or incorporated in another part or component of a process chamber for curing the coherent film 204.

Figure 10:
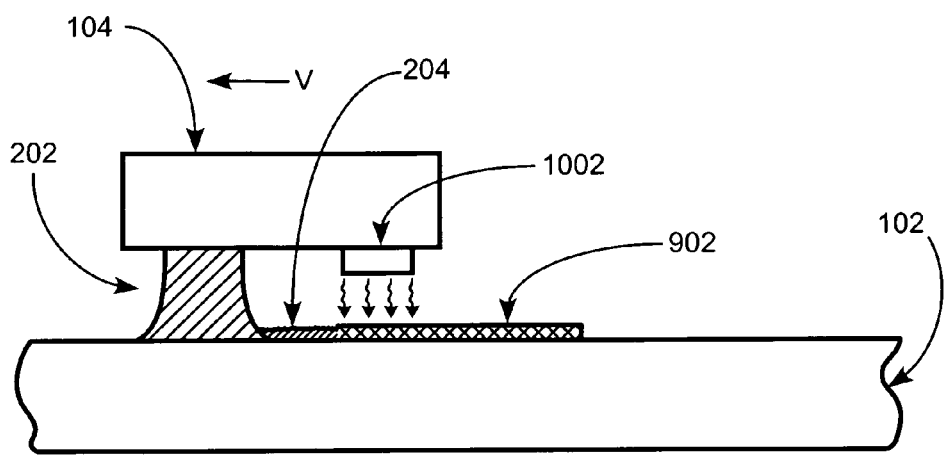
FIG. 10 is a diagram of a substrate, a proximity head, and a heat source, in accordance with one embodiment of the present invention.

FIG. 10 shows a substrate 102, proximity head 104 and heat source 1002 in accordance with one embodiment of the present invention. The heat source 1002 is configured to cure coherent film 204. As shown in FIG. 10, the proximity head 104 is scanned across the surface of the substrate 102. The proximity head 104 delivers a solution to form a coherent film 204 on the surface of the substrate 102 by means of a meniscus 202. The heat source 1002 is coupled to the proximity head 104. The heat source 1002 is capable of providing a sufficient amount of heat for curing the coherent film 204. The coherent film 204 is cured to form a cured coherent film 902.

In another embodiment of the present invention, the heat source 1002 may be incorporated in a substrate support to heat and cure the coherent film 204. In yet another embodiment of the present invention, heat source 1002 may be coupled or incorporated in other parts or components of a process chamber for curing the coherent film 204.

Figure 11:
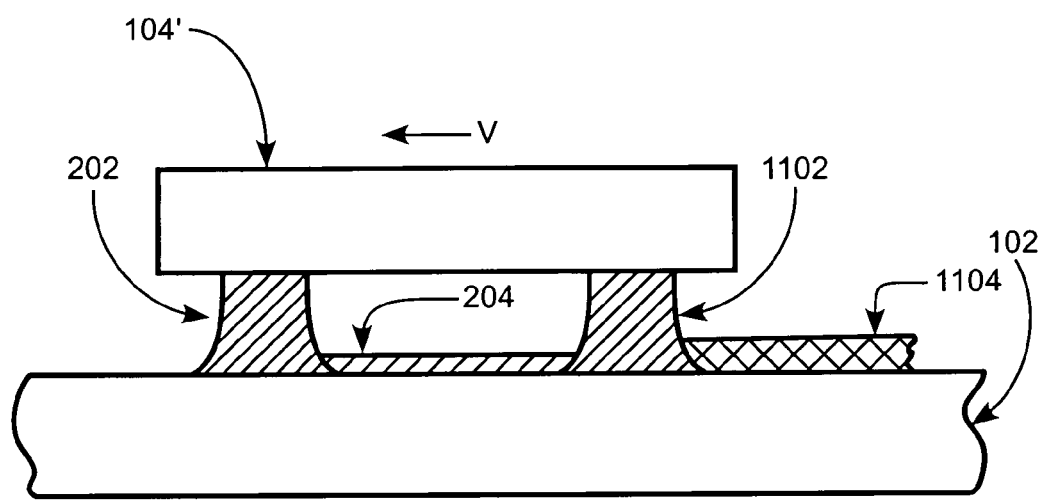
FIG. 11 is a diagram of a substrate and a proximity head, in accordance with one embodiment of the present invention.

FIG. 11 shows a proximity head 104' scanning over a substrate 102 in accordance with one embodiment of the present invention. Proximity head 104' delivers a first solution by means of a first meniscus 202 on to the surface of a substrate 102 forming a first coherent film 204. The first coherent film 204 treats the surface of the substrate 102. Treatment by the first coherent film 204 includes dissolving any residue film of material on the surface of the substrate 102. In addition, treatment by the first coherent film 204 also includes incorporating particles and any residue film of material that is not dissolved into the coherent film 204. Furthermore, the solution of the first coherent film may also treat the surface of the substrate 102, such that the treated surface of the substrate 102 may become hydrophobic or hydrophilic. The proximity head 104' delivers a second solution by means of a second meniscus 1102. The second solution from meniscus 1102 mixes with the solution of the first coherent film 204 to form a cured coherent film 1104. The cured coherent film 1104 binds particulates or particles and any residue film of material that is not dissolve to the cured coherent film 1104. The cured coherent film 1104 is removed by any suitable technique. For example, the cured coherent film 1104 may be removed by any suitable mechanical methods, such as peeling. Particles and residue material on the surface of the substrate 102 may be removed by removing the cured coherent film 1104 from the surface of the substrate 102.

Figure 12:
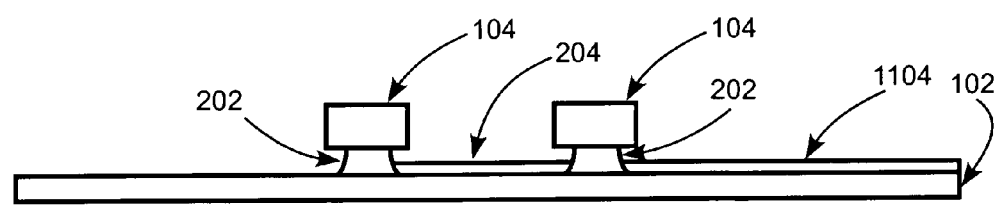
FIG. 12 is a diagram of a substrate and two proximity heads, in accordance with one embodiment of the present invention.

FIG. 12 shows a side view of a substrate 102 and two proximity bars 104 in accordance with one embodiment of the present invention. A first proximity head 104 delivers a first solution by way of a first meniscus 202 on the surface of the substrate 102 to form a coherent film 204. A second proximity head 104 delivers a second solution by way of a second meniscus 202 on the surface of the substrate 102. The second solution is mixed with the first solution on the surface of the substrate 102 to form a cured coherent film 1104.

Figure 13A:
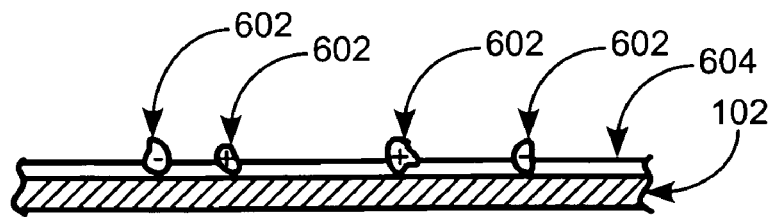
FIG. 13A is a diagram of substrate with a residue film and particles on a surface of the substrate, in accordance with one embodiment of the present invention.

FIG. 13A shows a residue film 604 and particles 602 on the surface of a substrate 102. In FIG. 13A, each particle 602 is shown as having a particular zeta potential, e.g., electrical charge, such as a positive charge or a negative charge. A particle 602 may be attracted to the substrate 102 if the zeta potential of the particle 602 has a opposite potential to that of the substrate 102. Accordingly, some of the particles 602 are attracted to the substrate 102. To facilitate the removal of the particles 602 from the surface of the substrate 102, it would be desirable to have a more negative zeta potential of the particles 602.

Figure 13B:
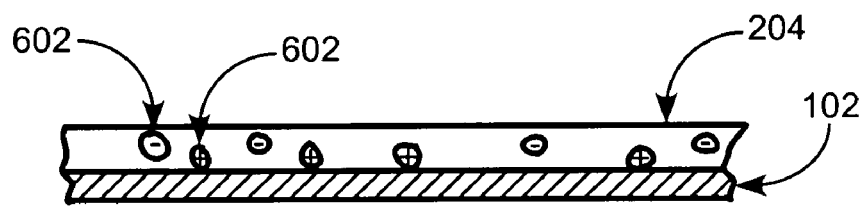
FIG. 13B is a diagram of a substrate and a coherent film on a surface of the substrate, in accordance with one embodiment of the present invention.

FIG. 13B shows a coherent film 204 being maintained by the substrate 102 according to one embodiment of the present invention. The solution forming the coherent film 204 reacts with the particles 602. The reaction affects the zeta potential of the particles 602, such that the particles 602 that were attracted to the substrate 102 are no longer attracted to the substrate 102. In addition, the solution of the coherent film 204 may also react and dissolve the residue film 604.

In another embodiment of the present invention, the solution of the coherent film 204 may not dissolve the residue film 604. Instead, the residue film 604 is bound to the coherent film 204. As the coherent film 204 is removed from the surface of the substrate 102, the residue film 604 is also removed from the surface of the substrate 102.

Figure 13C:
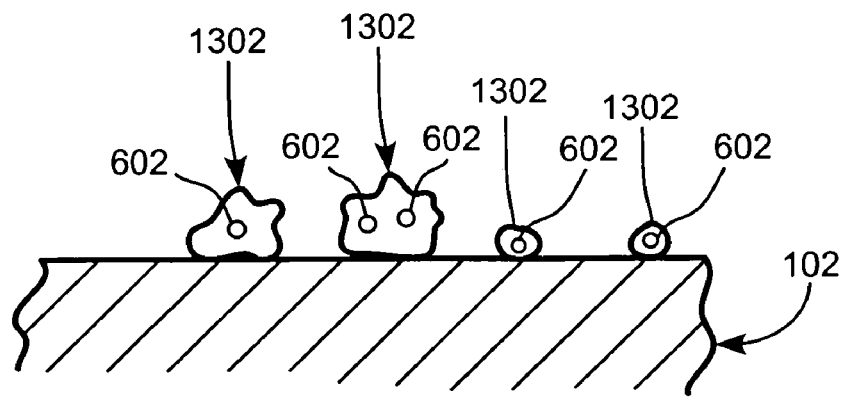
FIG. 13C is a diagram of a substrate and compounds on a surface of the substrate, in accordance with one embodiment of the present invention.

FIG. 13C shows that the coherent film 204 being dissolved and components of the coherent film being bound with particles 602 to form compounds 1302 in accordance with one embodiment of the present invention. In this embodiment, the coherent film 204 may be dissolved by any number of methods, for example, the coherent film 204 may be dissolve by being exposed to a dissolving agent. As the coherent film 204 is dissolved, compounds 1302 are left on the surface of substrate 102. Compounds 1302 are composed of one or more particles 602 that have reacted with the solution of the coherent film 204. Since compounds 1302 have a negative zeta potential, they are not attracted to the substrate 102, and they can be easily removed from the surface of the substrate 102 by any suitable method e.g., spin rinse, etc. After the compounds 1302 are removed, the surface of the substrate 102 is free from residue material and particles. The prepared surface of the substrate 102 as treated by the methods discussed is ready for a next step in the fabrication process (e.g., forming integrated circuits).

Figure 14:
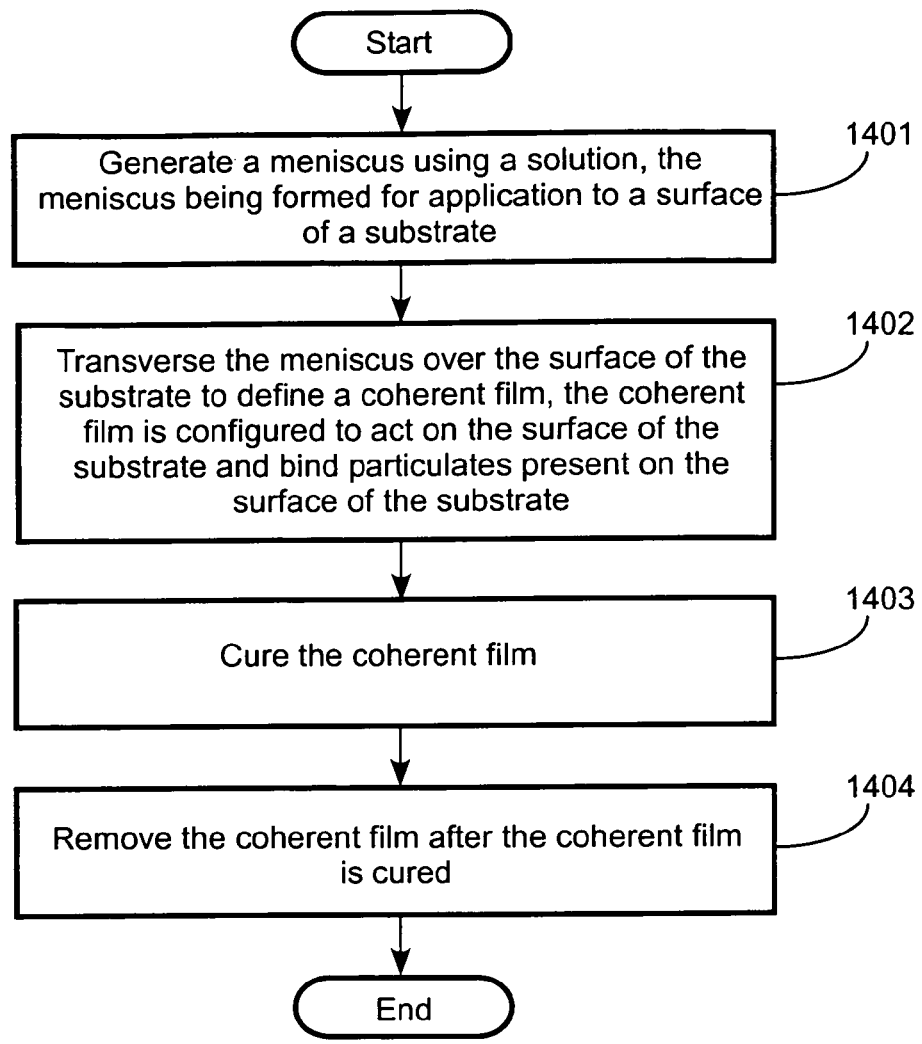
FIG. 14 is a flow chart detailing a surface preparation process, in accordance with one embodiment of the present invention.

FIG. 14 is a flow chart detailing a surface preparation process for a substrate in accordance with one embodiment of the present invention. The surface preparation process for a substrate begins by generating a meniscus using a solution in operation 1401. The meniscus is formed for applying the solution to a surface of the substrate. In operation 1402, the meniscus is traversed over the surface of the substrate to define a coherent film. The coherent film is maintained on the surface of the substrate. The coherent film is configured to act on the surface of the substrate. The coherent film may dissolve any residue material on the surface of the substrate. In addition, the coherent film may bind particulates that are present on the surface of the substrate. In operation 1403, the coherent film is cured. In one embodiment, the coherent film may be cured by light, e.g., ultraviolet light, infrared light, etc., that is provide by a suitable light source. In another embodiment, the coherent film may be cured by heat. In operation 1404, the coherent film may be removed by any suitable means. For example, the coherent film may be removed mechanically, such as the coherent film may be mechanically peeled from the surface of the substrate.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. A substrate preparation system, comprising:
   a proximity head having a head surface configured to be positioned near a surface of the substrate, the head surface including a first section and a second section, the first section includes a plurality of inlets for delivering a solution to the surface of the substrate and a plurality of outlets for removing a portion of the solution from the surface of the substrate, the plurality of inlets and the plurality of outlets are defined to maintain a fluid meniscus between the proximity head and the surface of the substrate, the surface of the substrate maintains a remaining portion of the solution as a coherent film after the proximity head scans over the surface of the substrate, and the second section includes a light source that is substantially parallel to the substrate and directed toward the coherent film;

wherein the coherent film is configured to be cured by the light source, the remaining portion of the solution acting on the surface of the substrate and binding particulates present on the surface of the substrate as the coherent film cures.

2. The substrate preparation system of claim 1, wherein the solution is formed by a first sub-solution and a second sub-solution, the first and second sub-solutions being mixed at a point of contact with the surface of the substrate to define the solution.

3. The substrate preparation system of claim 1, further comprising:

a second proximity head configured to deliver a second solution to the surface of the substrate, wherein the second solution mixes with the remaining portion.

4. The substrate preparation system of claim 3, wherein the mixing of the second solution with the remaining portion causes the coherent film to cure.

5. The substrate preparation system of claim 1, wherein the coherent film is configured to be removed from the surface of the substrate, the removing of the coherent film is configured to remove a portion of a surface film that has been acted upon by the coherent film.

6. The substrate preparation system of claim 1, wherein the coherent film is configured to be removed from the surface of the substrate, the removing of the coherent film is configured to remove the particulates that have been bound to the coherent film.

* * * * *